(12) United States Patent
Sugawara et al.

(10) Patent No.: US 7,667,544 B2
(45) Date of Patent: Feb. 23, 2010

(54) CLOCK REPRODUCING APPARATUS

(75) Inventors: Hiroshi Sugawara, Tokyo (JP); Toshimichi Suzuki, Tokyo (JP); Shigeo Uneme, Tokyo (JP); Shinji Iio, Tokyo (JP); Akira Miura, Tokyo (JP); Tadashige Fujita, Tokyo (JP); Akira Toyama, Tokyo (JP); Katsuya Ikezawa, Tokyo (JP); Hirotoshi Kodaka, Tokyo (JP); Sadaharu Oka, Tokyo (JP); Chie Sato, Tokyo (JP)

(73) Assignee: Yokogawa Electric Corporation, Tokyo (JP)

( * ) Notice: Subject to any disclaimer, the term of this patent is extended or adjusted under 35 U.S.C. 154(b) by 92 days.

(21) Appl. No.: 11/649,798

(22) Filed: Jan. 5, 2007

(65) Prior Publication Data

US 2007/0159938 A1 Jul. 12, 2007

(30) Foreign Application Priority Data

Jan. 12, 2006 (JP) .............................. 2006-005161
Jan. 12, 2006 (JP) .............................. 2006-005162

(51) Int. Cl.
*H03K 3/03* (2006.01)

(52) U.S. Cl. ........................... 331/1 A; 331/57; 375/326
(58) Field of Classification Search ................. 331/1 A, 331/57; 375/326
See application file for complete search history.

(56) References Cited

U.S. PATENT DOCUMENTS

| 5,382,921 | A | * | 1/1995 | Estrada et al. ............... 331/1 A |
| 6,259,326 | B1 | | 7/2001 | Dunlop et al. |
| 2004/0052316 | A1 | | 3/2004 | Choi et al. |

FOREIGN PATENT DOCUMENTS

| EP | 0 569 179 A2 | 11/1993 |
| JP | 2004-104522 A | 4/2004 |
| JP | 2004-179807 A | 6/2004 |

OTHER PUBLICATIONS

German Office Action dated Feb. 8, 2008.

* cited by examiner

*Primary Examiner*—Robert Pascal
*Assistant Examiner*—James E Goodley
(74) *Attorney, Agent, or Firm*—Sughrue Mion, PLLC

(57) ABSTRACT

A clock reproducing apparatus includes a clock reproducing circuit having: a gated oscillator having an oscillating circuit of two routes; and a frequency control circuit for comparing a phase of an output of the gated oscillator with a phase of a reference clock, and supplying a phase control signal to the gated oscillator based on the comparison result so as to set a delay time, input data is input to a reset input terminal of the gated oscillator, and different route of the two routes of the oscillating circuit operates depending on a case where the input data is "H" and a case where the input data is "L".

6 Claims, 15 Drawing Sheets

RESET

RESET   RESET

RESET

CLOCK REPRODUCING APPARATUS

This application claims foreign priorities based on Japanese Patent application No. 2006-005161, filed Jan. 12, 2006 and Japanese Patent application No. 2006-005162, filed Jan. 12, 2006, the contents of which are incorporated herein by reference in their entireties.

BACKGROUND OF THE INVENTION

1. Field of the Invention

The present invention is related to a clock reproducing apparatus. Recently, in a data transfer field, there is a need for transferring large amounts of data in high speeds. For example, such a method has been increased in which data transfer apparatuses are coupled to each other by employing optical fibers so as to transfer large amounts of data in high speeds. In this sort of transfer method, data transmitted via the optical fibers are converted into electric signals by an optical/electric converter, and thereafter, the data are reproduced. In this sort of technical field, since there are many possibilities that data are transmitted in a burst mode, a clock reproducing apparatus capable of reliably reproducing such data has been required.

2. Description of the Related Art

FIG. 20 is a block diagram for indicating a first example of a clock reproducing circuit of a related art. While this clock reproducing circuit employs a PLL (Phase-Located Loop) circuit, a clock in synchronism with input data is generated by an analog oscillator (VCO) 1 and a phase detector 2, and then, the generated clock is used as a reproduced clock. Also, a D type flip-flop (will be referred to as "DFF" hereinafter) 3 is operated by this clock so as to reproduce data.

In this clock reproducing circuit of the related art, input data ("DATA In") is input to one input terminal of the phase detector 2, and also, input to a data input terminal of the DFF 3. An output of the phase detector 2 is amplified by an amplifier 4, and thereafter, the amplified output signal is input to the VCO 1 as a "$V_{TUNE}$" signal. An output of the VCO 1 is amplified by an amplifier 5, and thereafter, the amplified signal is input to a clock input terminal of the DFF 3 and the other input terminal of the phase detector 2. Then, an output of the amplifier 5 becomes a reproduced clock, and the input data latched by this reproduced clock becomes output data (reproduced data). In the drawing, symbol "DATA out*" corresponds to an inverted output of "DATA out."

FIG. 21 is a block diagram for indicating a second example of a clock reproducing circuit of a related art. While this clock reproducing circuit employs two oscillators 11 and 12 equipped with reset terminals, one oscillator 11 operates when input data is "H", whereas the other oscillator 12 operates when input data is "L." Outputs of these two oscillators 11 and 12 are added so as to reproduce a clock in synchronism with input data. Also, similar to the above-explained case of FIG. 20, a D type flip-flop (DFF) 13 is operated by this reproduced clock so as to output reproduced data.

In this circuit, as an oscillator 11 (namely, first oscillator) and another oscillator 12 (namely, second oscillator), gated oscillators are employed. This gated oscillator will also be called as a ring oscillator. Input data (DATA In) is input to a reset input terminal of the first oscillator 11, and also, input to a data input terminal of the DFF 13. The input data is inverted by an inverter 14, and thereafter, the inverted data is input to a reset input terminal of the second oscillator 12.

The output of the first oscillator 11 and the output of the second oscillator 12 are input to an OR gate 15, and are input to a frequency control circuit 16, respectively. A reference clock is also input to the input terminal of the frequency control circuit 16. Then, output signals of the frequency control circuit 16 are supplied to the first and second oscillators 11 and 12 respectively as phase control signals which are used to set delay times. In accordance with the circuit provided in the above-explained manner, the first oscillator 11 operates when the input data is "H", the second oscillator 12 operates when the input data is "L", and the output signals of these first and second oscillators 11 and 12 are input to the OR gate 15, so that these output signals are added to output the added signal. This output of the OR gate 15 becomes a reproduced clock (CLOCK out), and the data input to the data input terminal of the DFF 13 is latched by the reproduced clock, and then, the latched data is output as reproduced data (DATA out).

FIG. 22 is a circuit diagram for showing a configuration of the above-explained gated oscillator, and is a known circuit. A reset signal is input to one input terminal of the AND gate 21. An output of this gated oscillator is input to the other input terminal. An output of the AND gate 21 is input via a buffer 22 to a plurality of inverters 23. The plural inverters 23 are connected in a series manner, an output of the inverter 23 of a final stage is output as an output (Output), and, as previously explained, that output is fed back to the other input terminal of the AND gate 21. This circuit constitutes a positive feedback circuit as an entire circuit, and is oscillated by, for instance, a power supply being turned ON, or noise, as a trigger. A frequency control signal is input to the respective gates 22 and 23. The frequency control signal corresponds to a phase control signal for setting a delay time of the oscillating circuit. In a case where a reset input is "L", an output of the AND gate 21 becomes "L", so that the circuit does not operate. In a case where a reset input is "H", an output of the AND gate 21 becomes "H", so that the circuit functions as an oscillating circuit.

As this sort of clock reproducing apparatus, the following technical idea is known. That is, for example, in a clock reproducing apparatus for controlling a ring oscillation, and for reproducing a clock signal from a received data signal to output the reproduced clock signal, an edge portion of a delay signal of the received data signal is controlled and inverted for each of edges of the received data signal based on a phase judging signal of the clock signal, and then, the inverted delay signal is injected into a loop of the ring oscillation so as to synchronize the clock signal (refer to, for example, JP-A-2004-104522). Also, another related technical idea is known. That is, such a clock reproducing apparatus is equipped with clock reproducing means for outputting a reproduced clock, and counting means for counting the reproduced clock being output from the clock reproducing means, and the clock reproducing means selects only valid clock information from clock information received from a transmission side and reproduces clock based on the selected received clock information and the count value of the count means (refer to, for instance, JP-A-2004-179807).

In the method of using the PLL circuit shown in FIG. 20, such a problem arises that this method cannot be utilized in a case of the burst mode (namely, packet data are intermittently transmitted) and to a signal of 0/1 series in which "0" and "1" continues for long time.

On the other hand, the method of adding the outputs of the two oscillators as indicated in FIG. 21 is capable of being employed even in the burst mode. However, this clock reproducing method owns the following problem. That is, in a case of such a high speed communication which is higher than or equal to 10 Gbps, when "0" and "1" are input, oscillation cannot be performed well, and stable operation of the circuit can be hardly realized.

SUMMARY OF THE INVENTION

The present invention has been made in view of the above circumstances, and provides a clock reproducing apparatus capable of being used in the burst mode, and also capable of being oscillated stably even in a case of a high speed communication which is higher than or equal to 10 Gbps.

In some implementations, a clock reproducing apparatus of the invention comprising:
  a clock reproducing circuit,
  wherein the clock reproducing circuit includes:
  a gated oscillator having an oscillating circuit of two routes; and
  a frequency control circuit for comparing a phase of an output of the gated oscillator with a phase of a reference clock, and supplying a phase control signal to the gated oscillator based on the comparison result so as to set a delay time,
  input data is input to a reset input terminal of the gated oscillator, and
  different route of the two routes of the oscillating circuit operates depending on a case where the input data is "H" and a case where the input data is "L".

In the clock reproducing apparatus, when one of the two routes of the oscillating circuit of the gated oscillator operates, the other of the two routes of the oscillating circuit on a non-operating side is reset.

In accordance with the above-described clock reproducing apparatus, while such a clock reproducing apparatus having two routes of oscillating circuit is employed as the gated oscillator, different route of the oscillating circuit operates depending on a case where the input data is "H" and a case where the input data is "L". As a result, the stability of the circuit becomes high. Also, upon switching between the two routes, the gated oscillator is reset, so that the oscillating circuit can be initialized. Also, the oscillating circuit can be used in the burst mode, and further, can be oscillated stably even in such a high speed communication which is higher than or equal to 10 Gbps. In accordance with the above-explained clock reproducing apparatus, the oscillating circuit on the non-operating side can be reliably reset.

In some implementations, a clock reproducing apparatus of the invention comprising:
  a pulse forming circuit which receives input data and forms a pulse from the input data; and
  a clock reproducing circuit,
  wherein the clock reproducing circuit includes:
  a gated oscillator; and
  a frequency control circuit for comparing a phase of an output of the gated oscillator with a phase of a reference clock, and supplying a phase control signal to the gated oscillator based on the comparison result so as to set a delay time, and
  wherein an output of the pulse forming circuit resets the gated oscillator, and
  an output of the gated oscillator is provided as a clock reproducing output.

In the clock reproducing apparatus, the pulse forming circuit is a differentiating circuit for differentiating the input data.

In the clock reproducing apparatus of the invention, the pulse forming circuit includes an AND gate for providing an AND of the input data and a signal that is obtained by delaying the input data for a predetermined amount.

In the clock reproducing apparatus, the pulse forming circuit includes an exclusive OR gate for providing an exclusive OR of the input data and a signal that is obtained by delaying the input data for a predetermined amount.

In some implementations, a clock reproducing apparatus of the invention comprising:
  a pulse forming circuit which detects a head of a packet which is input data and forms a reset pulse that is synchronized with the detected head; and
  a clock reproducing circuit,
  wherein the clock reproducing circuit includes:
  a gated oscillator; and
  a frequency control circuit for comparing a phase of an output of the gated oscillator with a phase of a reference clock, and supplying a phase control signal to the gated oscillator based on the comparison result so as to set a delay time, and
  wherein an output of the pulse forming circuit resets the gated oscillator, and
  an output of the gated oscillator is provided as a clock reproducing output.

In accordance with the above-explained clock pulse reproducing apparatus, when the data is input in the burst mode, the gated oscillator is reset and initialized by the output pulse of the pulse forming circuit in a predetermined time period. As a result, when the phase of the oscillation output is shifted, the phase of the oscillation output may be returned to the original phase by initialization, and the oscillating clock can be made stable.

In accordance with the above-described clock reproducing apparatus, the gated oscillator can be reset by the output of the differentiating circuit.

In accordance with the above-explained clock reproducing apparatus, since an AND of the input data and the signal that is obtained by delaying the input data for a predetermined delay amount is provided, a pulse having an arrow width can be produced, and thus, the gated oscillator can be reset by receiving this pulse.

In accordance with the above-explained clock reproducing apparatus, since an exclusively OR of the input data and the signal that is obtained by delaying the input data for a predetermined delay amount is provided, a pulse having a narrow width can be produced, and thus, the gated oscillator can be reset by receiving this pulse.

In accordance with the above-described clock reproducing apparatus, the head of the packet as the input data is detected so as to produce the pulse, and then, the gated oscillator can be reset by this pulse, so that this reset operation may contribute the stable oscillating operation.

BRIEF DESCRIPTION OF THE DRAWINGS

FIG. 13 is a diagram for showing operating waveforms of respective portions of the circuit shown in FIG. 11.

DESCRIPTION OF THE PREFERRED EMBODIMENTS

Referring now to drawings, embodiments of the present invention will be described in detail.

Figure 1:
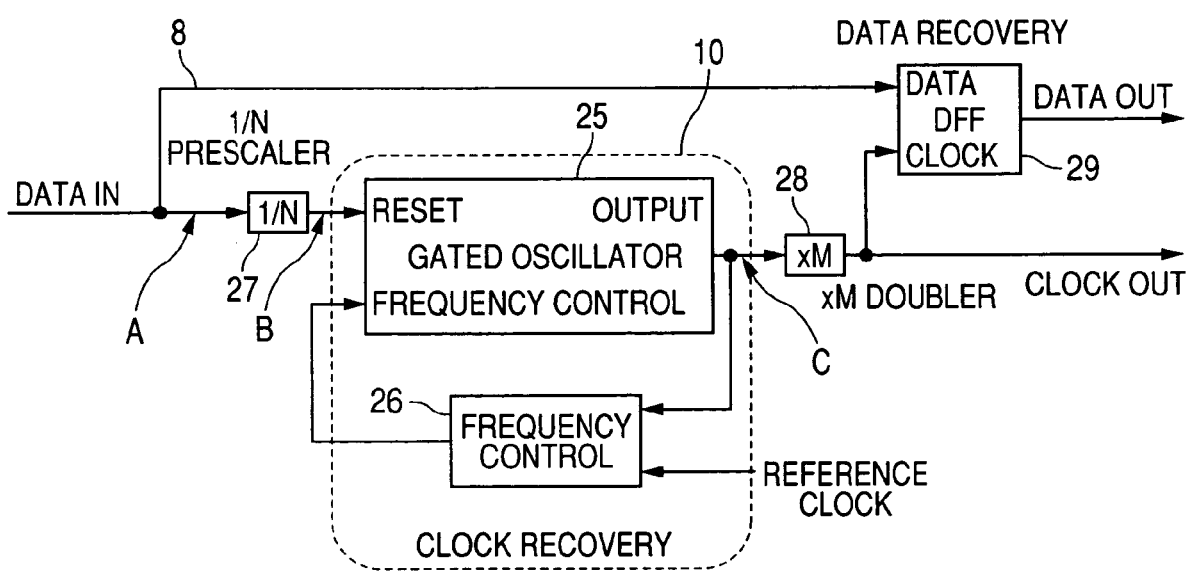
FIG. 1 is a block diagram for showing a clock reproducing apparatus according to a first embodiment of the present invention.

FIG. 1 is a block diagram for showing a clock reproducing apparatus of a first embodiment of the present invention. In this drawing, reference numeral 10 indicates a clock reproducing circuit. The clock reproducing circuit 10 includes a gated oscillator 25, and a frequency control circuit 26 for comparing an output of the gated oscillator 25 with a reference clock, and for supplying a phase control signal for setting a delay time to the gated oscillator 25 based on a comparison result. Reference numeral 27 shows a 1/N frequency divider or a prescaler for dividing a frequency of input data by 1/N, and reference numeral 28 indicates an M frequency multiplier or M-doubler for multiplying an output of the clock reproducing circuit 10 by M, and an output of the M frequency multiplier 28 is input to a clock input terminal of a D type flip-flop (will be abbreviated as "DFF" hereinafter) 29. On the other hand, the input data is directly input via a signal line 8 (delay line) to a data input terminal of the DFF 29. It should be noted that the 1/N frequency divider 27 is not always required.

In the clock reproducing circuit 10, reference number 25 indicates the above-explained gated oscillator, and reference numeral 26 indicates a frequency control circuit. The output of the gated oscillator 25 is input to one input terminal of the frequency control circuit 26, and the reference clock is input to the other input terminal of the frequency control circuit 26. Then, an output of the frequency control circuit 26 is input to the gated oscillator 25 as a phase control signal for setting a delay time.

Figure 2:
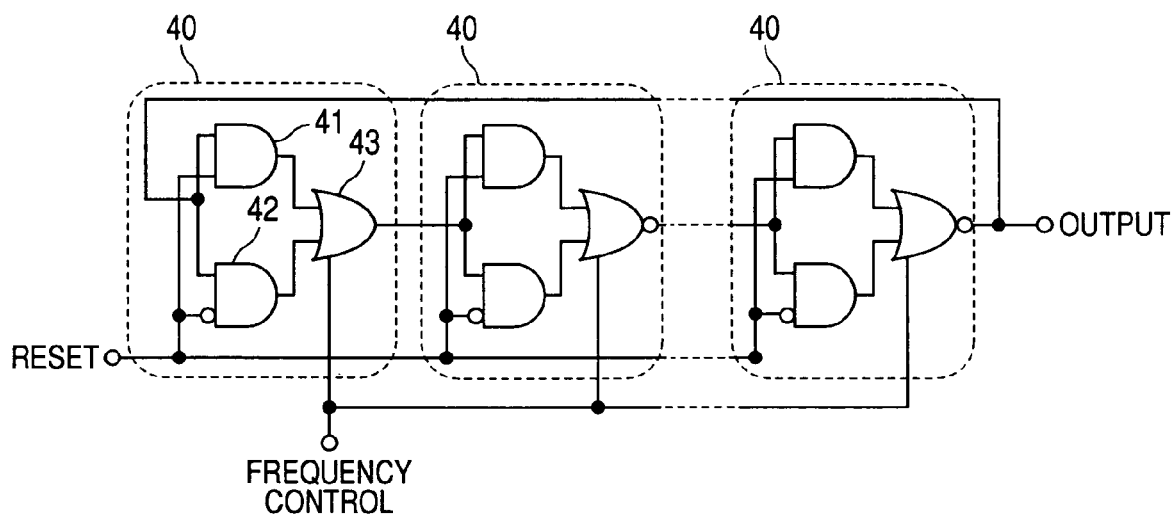
FIG. 2 is a diagram for showing a first structural example of a selector type gated oscillator.

FIG. 2 is a diagram for showing a first structural example of the selector type gated oscillator 25. In this drawing, reference numeral 40 shows units constituting the gated oscillator, and includes an AND gate 41, another AND gate 42, and an OR gate 43 which receives outputs of these AND gates 41 and 42. Then, an output of the unit 40 at a final stage is fed back to the unit 40 at the first stage so as to be input to one input terminals of the AND gates 41 and 42. A phase control signal (frequency control signal) is input to the OR gates 43 of the respective units 40, so that a delay time of these units 40 is set. This delay time is employed so as to control a frequency.

A reset signal is directly input to the AND gate 41, whereas this reset signal is inverted and then the inverted reset signal is input to the AND gate 42. As a consequence, the AND gates 41 and 42 become alternately active in response to an "H" level of a reset signal, and an "L" level of this reset signal. For instance, when the signal level of the reset signal becomes the "H" level, the AND gate 41 becomes active, whereas when the signal level of the reset signal becomes the "L" level, the AND gate 42 becomes active. Since outputs of these AND gates 41 and 42 are input to the OR gate 43, the outputs of two routes of the oscillating circuit are added to each other, and the added output is input from this unit 40. As a consequence, as an output (Output) of the unit 40 at the final stage, the added value of the two routes of the oscillating circuit is output.

Figure 3A:
FIG. 3 is a diagram for showing operating waveforms of respective portions of the circuit shown in FIG. 1.
Figure 3B:
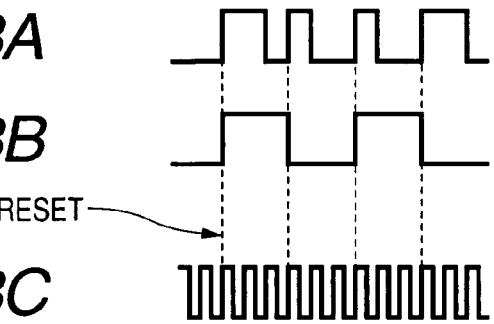
Figure 3C:

FIG. 3 is a diagram for showing operating waveforms of respective portions within the circuit shown in FIG. 1. Symbol "A" indicates input data, symbol "B" represents an output of the 1/N frequency divider 27 (in this case, assuming now that N=2, ½ frequency division is represented), and symbol "C" shows a reproduced clock which is the output of the clock reproducing circuit 10. A description is made of operations of the circuit arranged in the above-described manner.

Figure 4A:
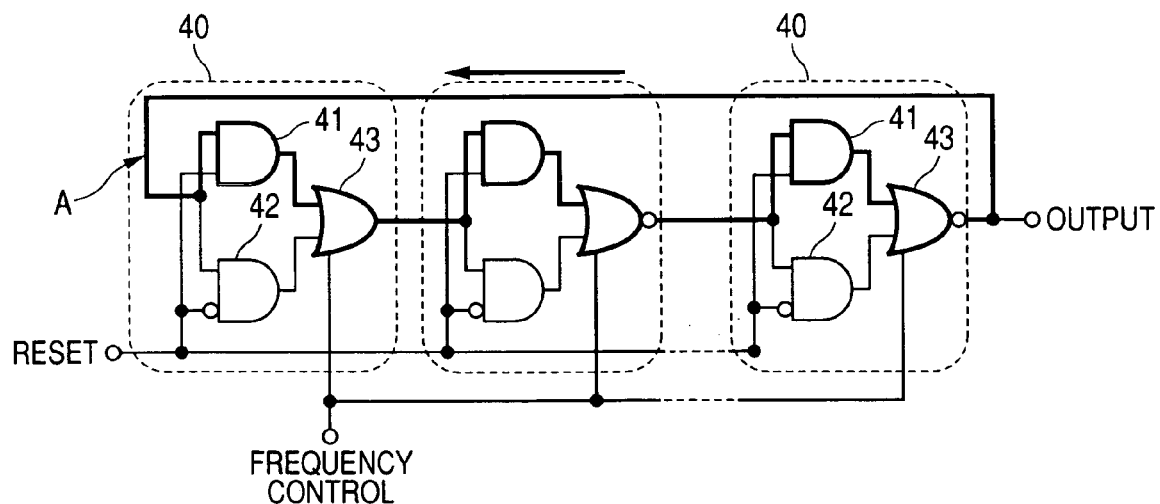
FIG. 4 is a diagram for showing operations of the selector type gated oscillator.
Figure 4B:
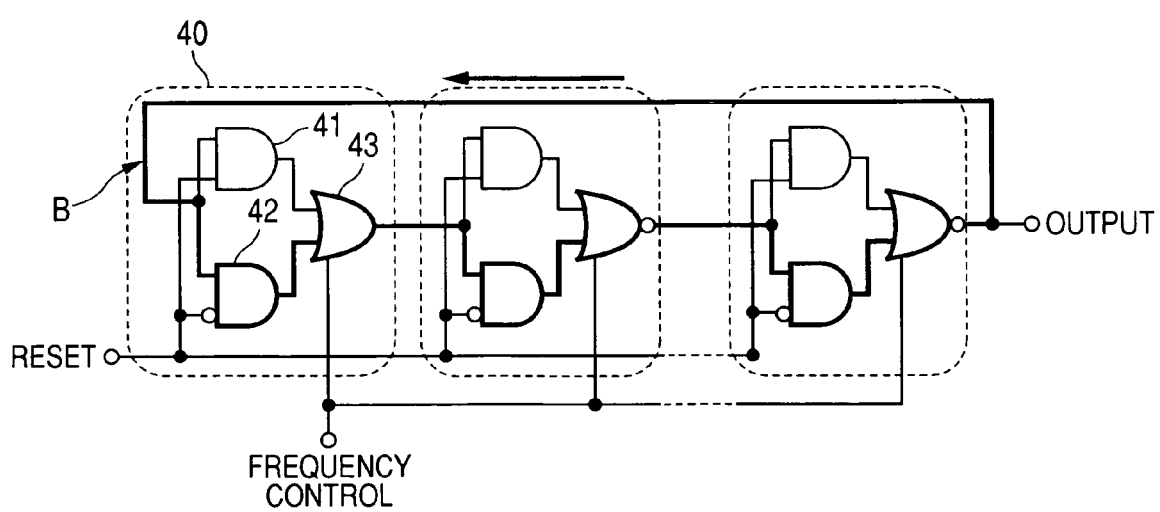

The input data (DATA In) indicated by symbol "A" is frequency-divided by ½ in the ½ frequency divider 27, and then, becomes such a waveform indicated by symbol "B." In this case, when a level of the output signal of the ½ frequency divider 27 becomes "H", the AND gate 41 of the unit 40 becomes active, and a circuit is connected by way of a route shown as "A" of FIG. 4A, and then, a reproduced clock is output from the OR gate 43 of the unit 40 at the final stage. On the other hand, when a level of the output signal of the ½ frequency divider 27 becomes "L", the AND gate 42 of the unit 40 becomes active, and a circuit is connected by way of a route shown as "B" of FIG. 4B, and then, a reproduced clock is output from the OR gate 43 of the unit 40 at the final stage. In other words, the output of the oscillating circuit shown in FIG. 4A is added to the output of the oscillating circuit indicated in FIG. 4B by the OR gate 43, so that the added output is output as the reproduced clock.

The reproduced clock is multiplied by "M" in the M frequency multiplier 28, and thereafter, M-multiplied reproduced clock is input to the DFF 29 as a clock. While the input data has been input to the data input terminal of the DFF 29, this input data is latched by a rising edge of the clock. At this time, a timing adjustment between the input data and the clock is carried out by adjusting a delay amount of a signal line (Delay line) 8. Then, the reproduced data (DATA out) is output from the DFF 29. Also, the actual reproduced clock is output from the output terminal of the M frequency multiplier 28.

Figure 5:
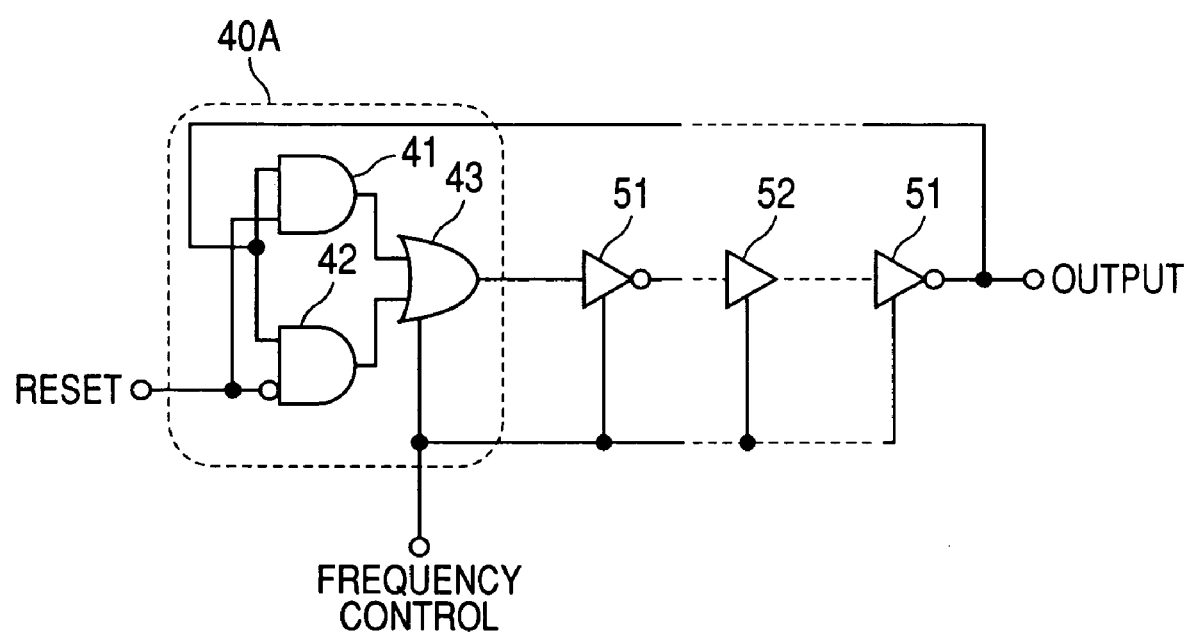
FIG. 5 is a diagram for showing a second structural example of the selector type gated oscillator.

FIG. 5 is a diagram for showing a second structural example as to the selector type gated oscillator 25. In this circuit, while a circuit 40A corresponding to the unit 40 of FIG. 2 is provided at an input stage, this circuit 40A includes AND gates 41, 42, and an OR gate 43. Then, an output of this circuit 40A is input to a series connected circuit of inverters

51. A phase control signal is supplied to the OR gate 43, the inverters 51, and the buffer 52, and a feedback signal is input from the output of the inverter 51 at the final stage to the AND gates 41 and 42 of the circuit 40A. In this case, a total number of these inverters 51 being provided is an odd number in order to perform a stable oscillating operation.

Figure 6A:
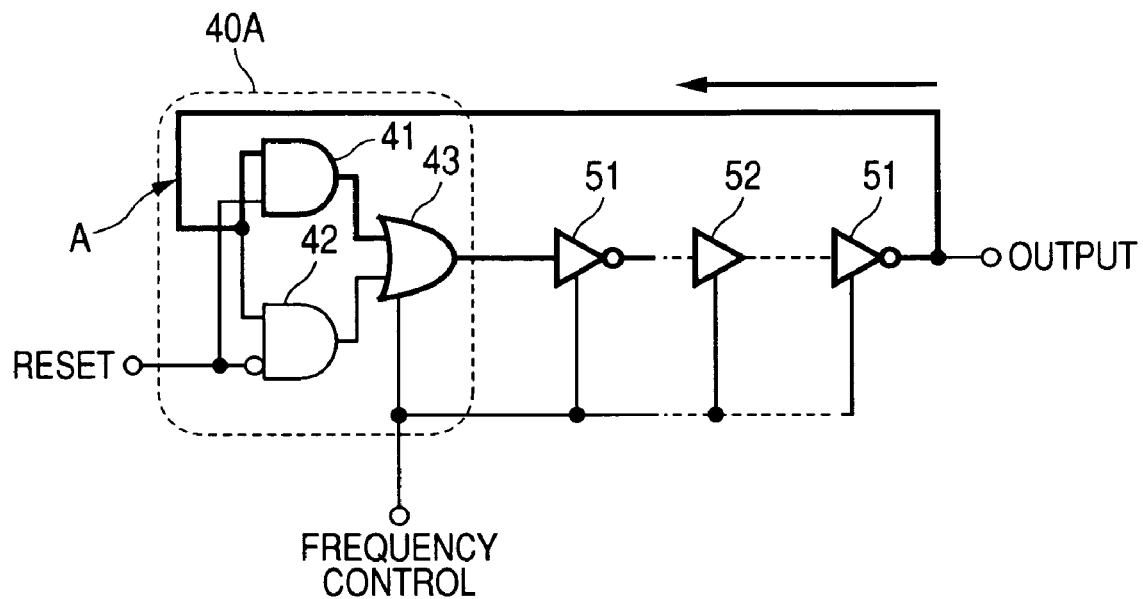
FIG. 6 is a diagram for showing operations of a second selector type gated oscillator.
Figure 6B:
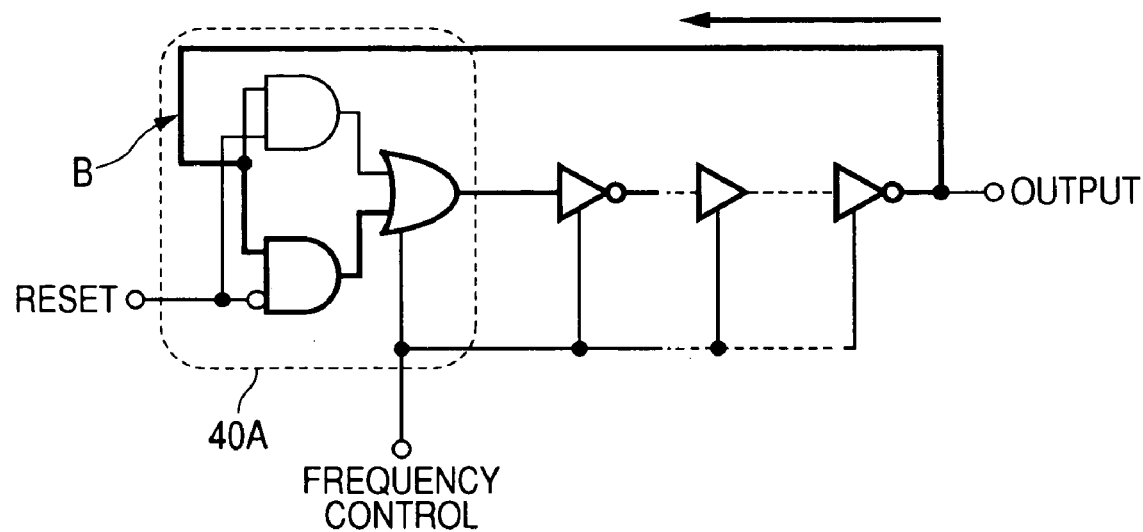

In the circuit arranged in the above-described manner, when a level of the reset signal becomes "H", the AND gate 41 becomes active. As a result, an oscillating circuit is formed in a route "A" shown in FIG. 6A. On the other hand, when a level of the reset signal becomes "L", the AND gate 42 becomes active. As a result, an oscillating circuit is formed in a route B represented in FIG. 6B. Then, the oscillation outputs of the respective routes A and B are added at the OR gate 43 and a reproduced clock is obtained.

Figure 7:
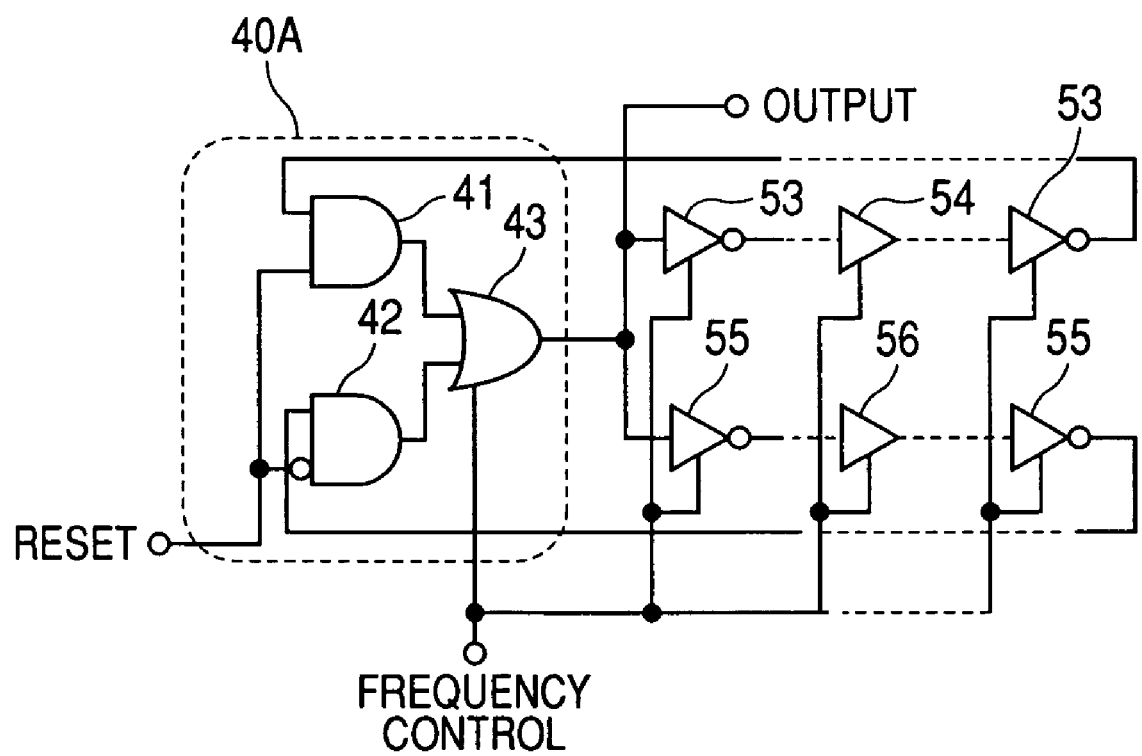
FIG. 7 is a diagram for showing a third structural example of the selector type gated oscillator.

FIG. 7 is a diagram for showing a third structural example as to the selector type gated oscillator 25. In this circuit, while a circuit 40B corresponding to the unit 40 of FIG. 2 is provided at an input stage, this circuit 40A includes AND gates 41, 42, and an OR gate 43. Then, an output of the OR gate 43 is connected to both a series circuit of inverters 53 and a series circuit of inverters 55. It should also be noted that buffers 54 and 56 are connected to the series oscillating circuit made of these inverters 53 and 55, if necessary. Then, an output of the OR gate 43 becomes a reproduced clock. A phase control signal is input to the OR gate 43 and the inverters 53 and 55.

Figure 8A:
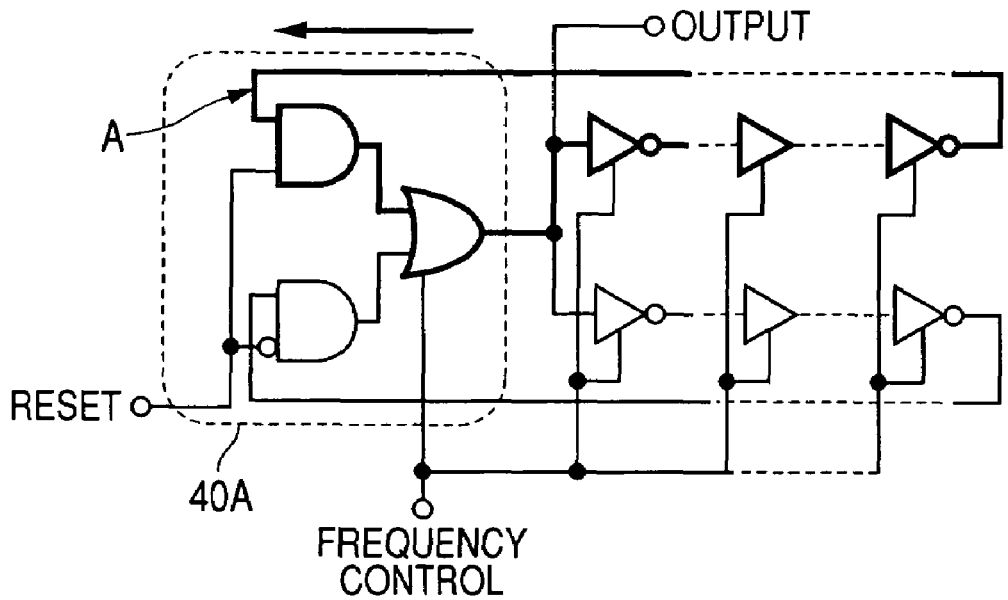
FIG. 8 is a diagram for showing operations of a third selector type gated oscillator.
Figure 8B:
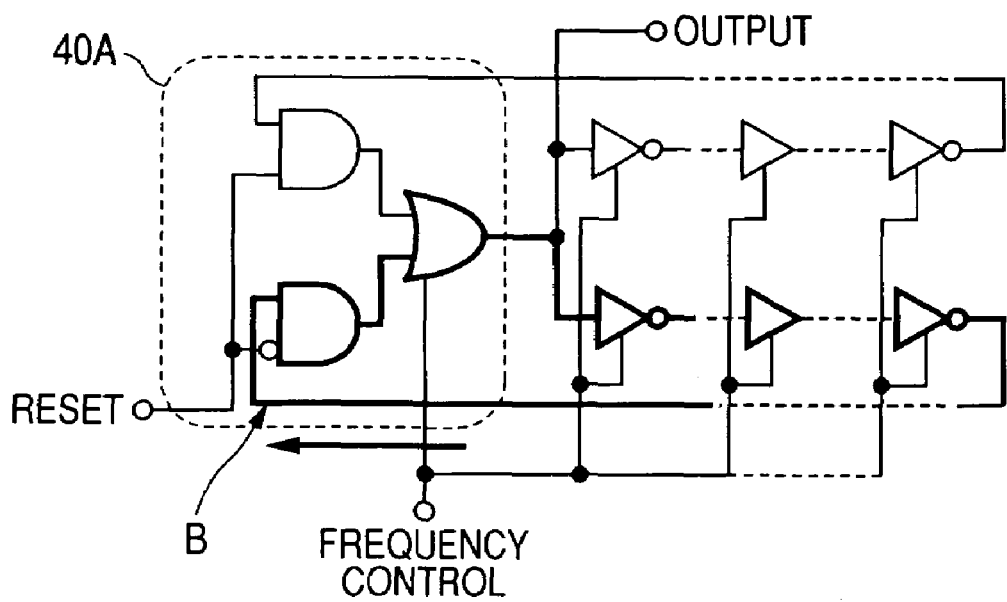

In the circuit arranged in the above-described manner, when a level of the reset signal becomes "H", the AND gate 41 becomes active. As a result, an oscillating circuit is formed in a route "A" shown in FIG. 8A. On the other hand, when a level of the reset signal becomes "L", the AND gate 42 becomes active. As a result, an oscillating circuit is formed in a route B represented in FIG. 8B. Then, the oscillation outputs of the respective routes A and B are added at the OR gate 43 and a reproduced clock is obtained.

Figure 9:
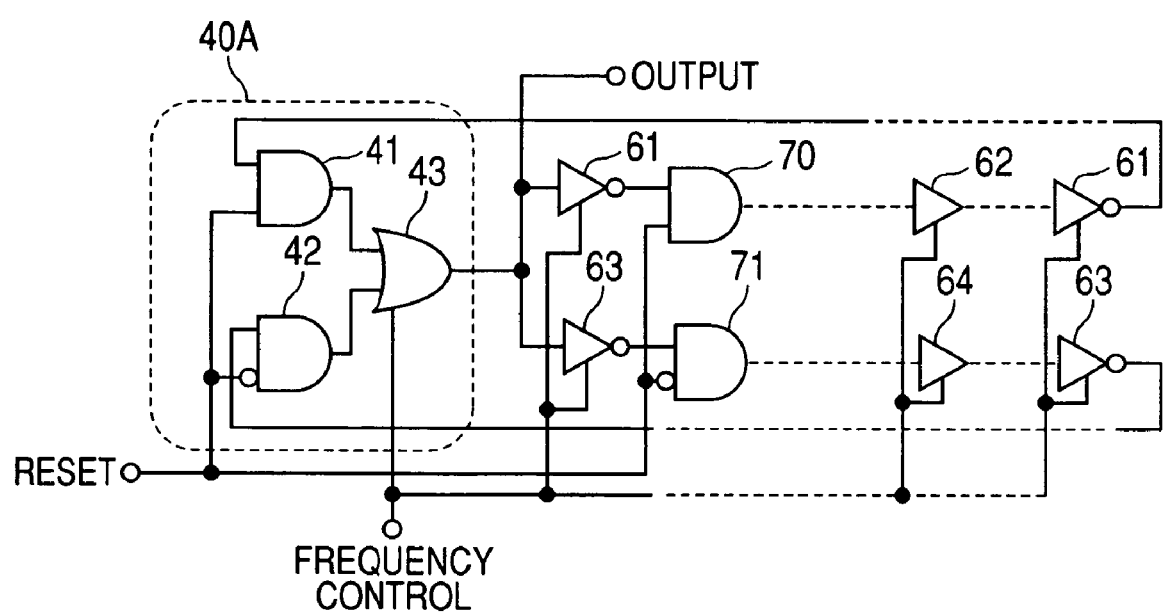
FIG. 9 is a diagram for showing a fourth structural example of the selector type gated oscillator.

FIG. 9 is a diagram for showing a fourth structural example as to the selector type gated oscillator 25. In this circuit, while a circuit 40A corresponding to the unit 40 of FIG. 2 is provided at an input stage, this circuit 40A includes AND gates 41, 42, and an OR gate 43. Then, an output of the OR gate 43 is input to inverters 61 and 63. Reference numeral 70 indicates an AND gate in which the output of the inverter 61 is received at one input terminal of the AND gate 70. Reference numeral 71 shows an AND gate in which the output of the inverter 63 is received at one input terminal of the AND gate 71. A reset signal is input to the other input terminal of each of these AND gates 70 and 71. A phase control signal is input to the OR gate 43, the inverters 61 and 63, and also, the buffers 62 and 64.

Figure 10A:
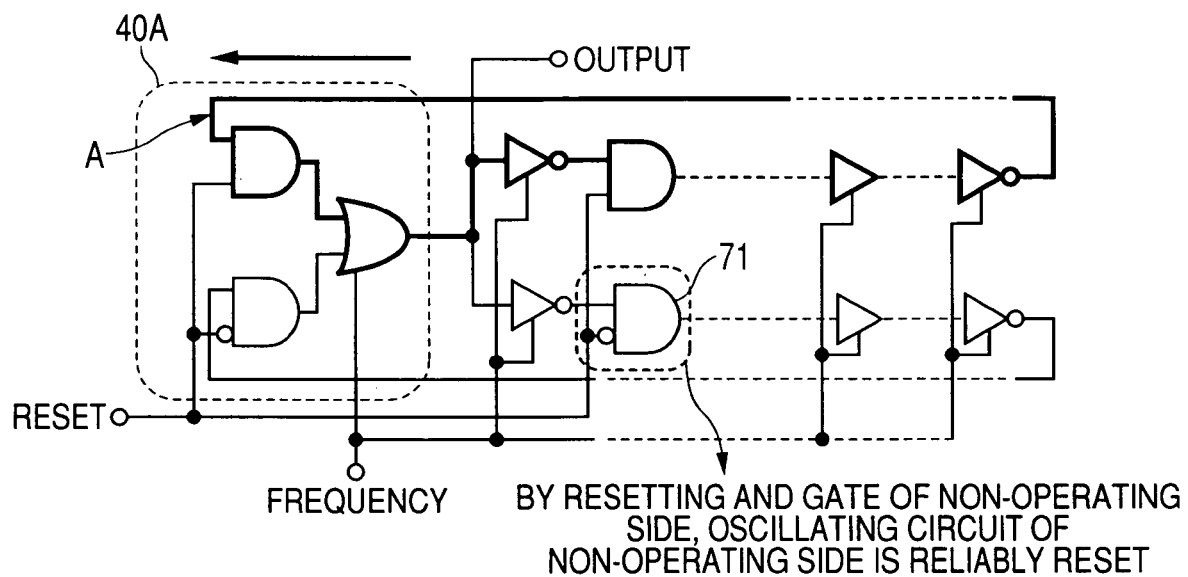
FIG. 10 is a diagram for showing operations of the fourth selector type gated oscillator.
Figure 10B:
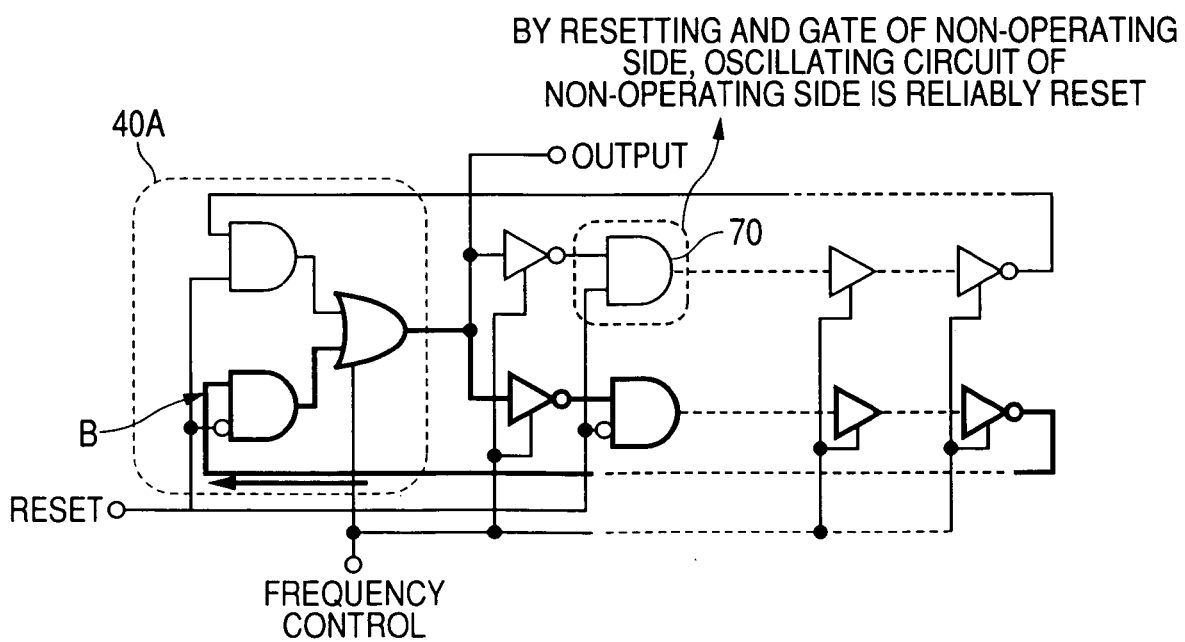

In the circuit arranged in the above-described manner, when a level of the reset signal becomes "H", an oscillating circuit is formed in a route "A" shown in FIG. 10A. On the other hand, since the AND gate 71 provided on the non-operating side is reset, the oscillating circuit on the non-operating side can be reliably reset. When a level of the reset signal becomes "L", an oscillating circuit is formed in a route B represented in FIG. 10B. At this time, since the AND gate 70 provided on the non-operating side is reset, the oscillating circuit on the non-operating side can be reliably reset.

As previously explained, in accordance with the embodiments of the present invention, such a clock reproducing apparatus can be provided. That is, the clock reproducing apparatus can be operated in the burst mode, and also, can be oscillated stably even in the high speed communication which is higher than or equal to 10 Gbps.

Figure 11:
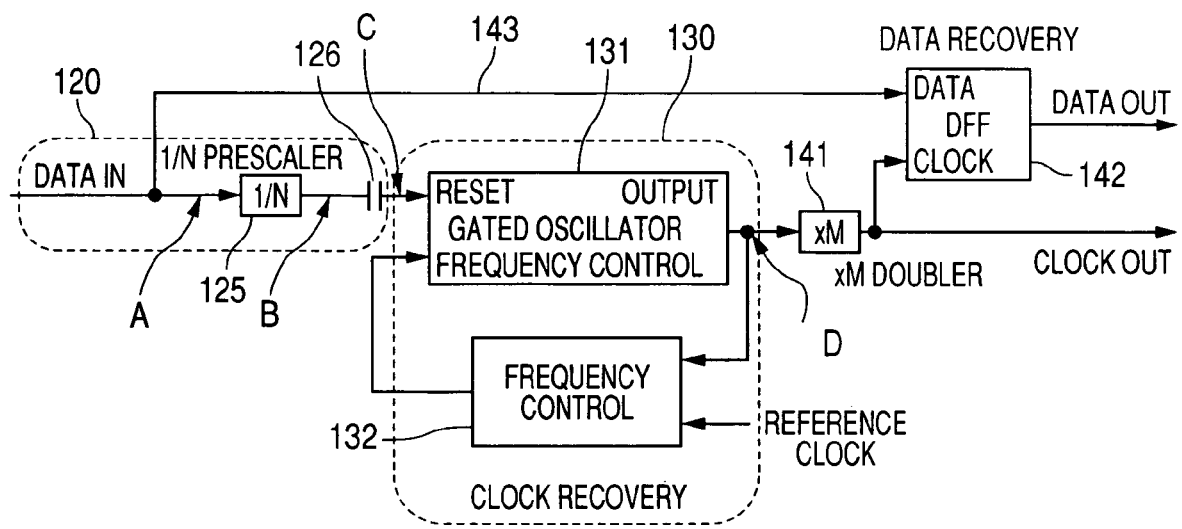
FIG. 11 is a block diagram for showing a clock reproducing apparatus according to a second embodiment of the present invention.

FIG. 11 is a block diagram for showing a clock reproducing apparatus according to a second embodiment of the present invention. In this drawing, reference numeral 120 shows a pulse forming circuit which receives input data (DATA In) so as to form a pulse from the received input data. Reference numeral 130 represents a clock reproducing circuit including a gated oscillator 131 and a frequency control circuit 132 for comparing an output of the gated oscillator 131 with a reference clock, and for supplying a phase control signal for setting a delay time to the gated oscillator 131 based on a comparison result.

The pulse forming circuit 120 is a circuit for generating a reset pulse in synchronism with an input signal (data). The clock reproducing circuit 130 is a circuit for reproducing a clock in synchronism with the reset pulse. In the pulse forming circuit 120, reference numeral 125 shows a frequency divider which divides the input signal by 1/N, and reference numeral 126 represents a capacitor having a capacity "C", which receives the output of the frequency divider 125 so as to differentiate the received output. It should also be noted that the frequency divider 125 is not always required. In an actual case, since a resistor is present in a signal line, an RC differentiating circuit is provided by a resistance value "R" of this resistor and the capacitor "C." An output of this differentiating circuit is input as a reset pulse to the gated oscillator 131. As a result, the gated oscillator 131 may be synchronized by the reset pulse.

In the clock reproducing circuit 130, reference number 131 indicates the above-explained gated oscillator, and reference numeral 132 indicates a frequency control circuit. The output of the gated oscillator 131 is input to one input terminal of the frequency control circuit 132, and the reference clock is input to the other input terminal of the frequency control circuit 132. Then, an output of the frequency control circuit 132 is input to the gated oscillator 131 as a phase control signal for setting a delay time.

Figure 12:
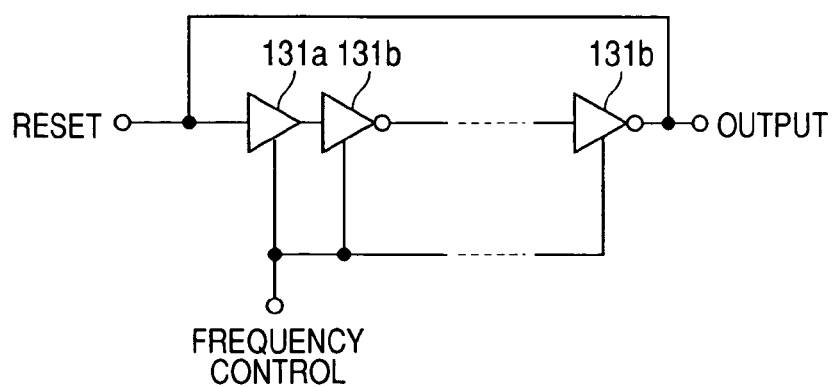
FIG. 12 is a diagram for showing a structural example as to the gated oscillator employed in FIG. 11.

FIG. 12 is a diagram for showing a structural example of the gated oscillator 131 employed in FIG. 11. This gated oscillator 131 includes a reset input terminal, a buffer 131a into which a signal derived from the reset input terminal is input, and a plurality of inverters 131b which receive an output of the buffer 131a. While the plural pieces of these inverters 131b are series-connected, a total number of these inverters 131b is selected to be an odd number so as to perform a stable oscillation. A frequency control signal (phase control signal) is input to both the buffer 131a and the respective inverters 131b so as to set a delay time of the oscillator and determine a reset pulse width.

FIG. 13 is a diagram for showing operating waveforms of respective portions within the circuit shown in FIG. 11. Symbol "A" indicates input data, and symbol "B" represents a frequency-divided output by a ½ frequency divider 125. In this case, although an example is shown that N=2 as a dividing number N, namely, a ½ frequency division is employed, the present invention is not limited thereto. Symbol "C" shows a differential output waveform of the differentiating circuit. Any one of a positive direction pulse and a negative direction pulse of this differential waveform may be employed as a reset pulse. Symbol "D" indicates an output of the gated oscillator 131. Reference numeral 141 indicates a frequency multiplier which multiplies the output of the gated oscillator 131. A multiplication factor of the frequency multiplier 141 is "M." The M frequency multiplier 141 is located at a place deviated from the loop of the circuit, and can multiply the reproduced clock of the gated oscillator 131 by the multiplication factor "M." As multiplied frequencies, for example, 40 GHz, 20 GHz, 10 GHz, etc., are employed.

In an actual case, a clock which is multiplied by the multiplication factor "M" in the frequency multiplier 141 is output as a reproduced clock (CLOCK out). This reproduced clock is supplied to a clock input terminal of the 142 so as to latch input data being input to a D input terminal of this DFF 142. It should be noted that a delay line for adjusting both timing of an input clock and timing of input data is provided in the signal line 143. Since the delay amount of this delay line is adjusted, the input data can be reliably latched by the reproduced clock. The latched data becomes reproduced data (DATA out). Operations of the clock reproducing circuit arranged in the above-explained manner will now be explained.

Firstly, input data is input to the pulse forming circuit 120, so that a differential pulse is formed. This differential pulse becomes a reset pulse of the gated oscillator 131. The clock reproducing circuit 130 generates a reproduced clock. Since this clock reproducing circuit 130 is reset by a differential pulse of the differentiating circuit, the clock reproducing circuit 130 is initialized every time it is reset by the differential pulse. As a result, before delays of phases become apparent, the clock reproducing circuit 130 is reset so as to be returned to the initial state. As a result, the stable oscillation can be maintained. It should also be noted that although the reproduced clock is output from the gated oscillator 131, the frequency of this reproduced clock is equal to that of the reference clock.

Effects of this circuit will now be listed as follows:
1) There is no limitation as to a packet length of input data.
2) A stable operation can be obtained even in a high bit rate.
3) Preassemble is no longer required. In this case, preassemble is to provide a header for establishing synchronization, at a head of a packet. In accordance with this second embodiment, such a measure is no longer required.
4) In view of the circuit configuration, the clocks can be reproduced even in such a time period when no packet is provided.

Figures 13A, 13B, 13C, 13D, 14:
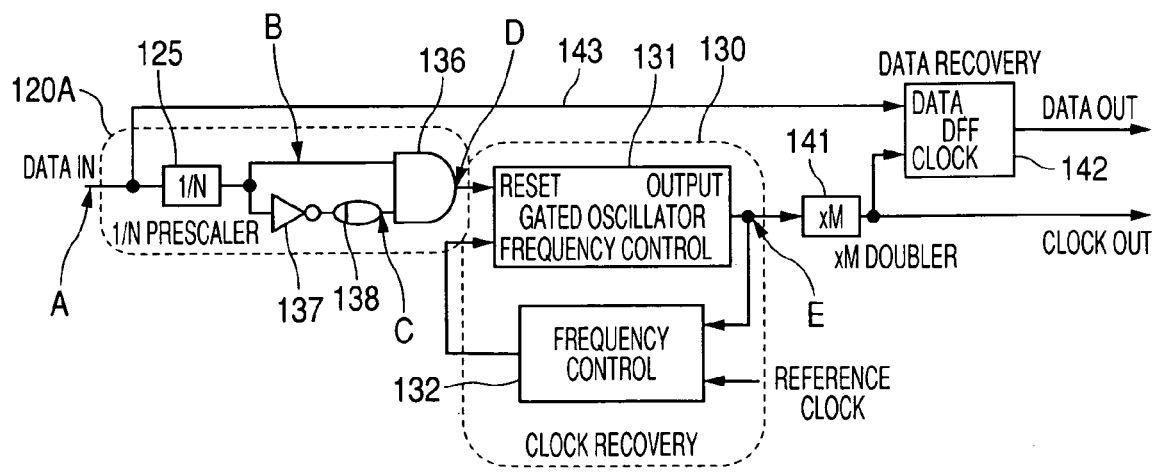
FIG. 14 is a block diagram for showing a first structural example of a third embodiment of the present invention.
Figure 15A:
FIG. 15 is a diagram for showing operating waveforms of the respective circuit portions of the circuit shown in FIG. 14.
Figure 15B:
Figure 15C:
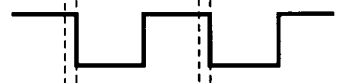
Figure 15D:
Figure 15E:
Figure 22:
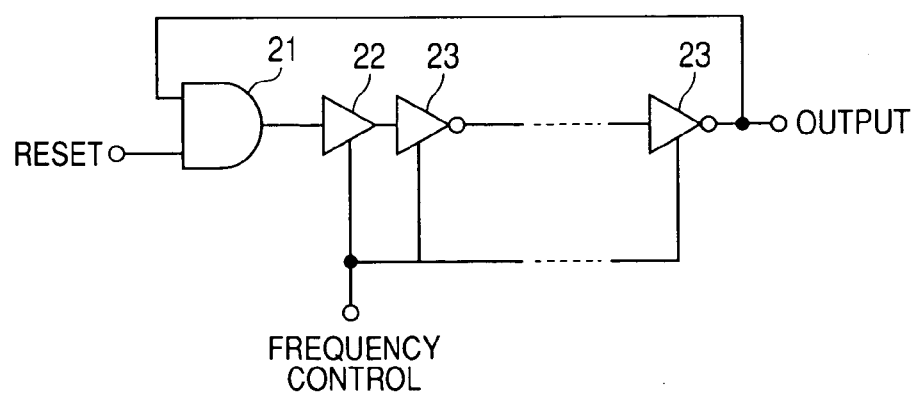
FIG. 22 is a diagram for showing a configuration of the gated oscillator employed in FIG. 21.

FIG. 14 is a block diagram for showing a first structural example of a clock reproducing apparatus according to a third embodiment of the present invention. It should be noted that the same reference numerals shown in FIG. 11 are employed as those for the same circuit elements, and explanation thereof are not repeatedly made. In the drawings, reference numeral 120A shows a pulse forming circuit. This pulse forming circuit 120A forms a reset pulse not by using a differentiating circuit, but by employing an AND circuit. Arrangements of a clock reproducing circuit 130, a frequency multiplier 141, and a DFF 142 are identical to those of FIG. 11. It should also be noted that as a gated oscillator, such a gated oscillator shown in FIG. 22 is employed.

A description is made of operations of the pulse forming circuit 120A in the circuit arranged in the above-explained manner. In this circuit, reference numeral 125 shows a 1/N frequency divider. In this case, a ½ frequency dividing operation is represented. An output of this 1/N frequency divider 125 is input to one input terminal of the AND gate 136, and also to the inverter 137. An output of the inverter 137 is input to the delay element 138 so as to be delayed by a predetermined time. An AND of the delayed output and the input data that is directly input is obtained by the AND gate 136.

Operations as to this circuit portion will now be explained with reference to a time chart of FIG. 15. Symbol "A" indicates input data, symbol "B" represents input data which is frequency-divided by 1/N, and symbol "C" indicates input data delayed by the delay element 138. An AND of an output of this 1/N frequency divider 125 and the input data delayed by the delay element 138 is obtained, so that such a pulse as shown by "D" is output from the AND gate 136. Since a reset pulse is input from the output of the AND gate 136 to the gated oscillator 131, the gated oscillator 131 is synchronized, and the output of the gated oscillator 131 is returned to an initial value every time the reset pulse is input. As a consequence, when the phase is going to be shifted, the output of the gated oscillator 131 is returned back to the initial value, so that such a stable reproduced clock without any phase shift as represented in E of FIG. 15 can be obtained. Then, the stable reproduced clock is output from the frequency multiplier 141, and the stable reproduced data is output from the DFF 142.

Figure 16:
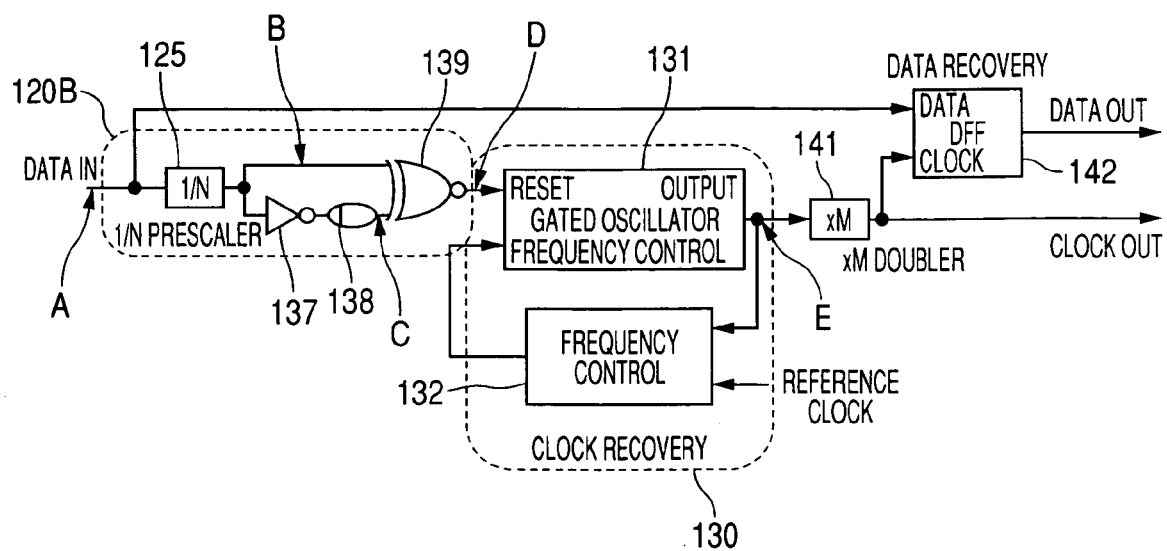
FIG. 16 is a block diagram for showing a second structural example of the third embodiment of the present invention.
Figure 17A:
FIG. 17 is a diagram for showing operating waveforms of the respective circuit portions of the circuit shown in FIG. 16.
Figure 17B:
Figure 17C:
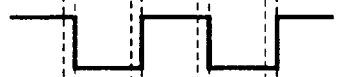
Figure 17D:
Figure 17E:

FIG. 16 is a block diagram for showing a second structural example of a clock reproducing apparatus according to the third embodiment of the present invention. It should be noted that the same reference numerals shown in FIG. 14 are employed as those for the same circuit elements, and explanation thereof are not repeatedly made. In the drawings, reference numeral 120B shows a pulse forming circuit. This pulse forming circuit 120B forms a reset pulse not by using a differentiating circuit, but by employing an exclusive OR (EXOR) gate 139. Arrangements of a clock reproducing circuit 130, a frequency multiplier 141, and a DFF 142 are identical to those of FIG. 11. It should also be noted that as a gated oscillator, such a gated oscillator shown in FIG. 22 is employed.

A description is made of operations of the pulse forming circuit 120B in the circuit arranged in the above-explained manner. In this circuit, reference numeral 125 shows a 1/N frequency divider. In this case, a ½ frequency dividing operation is represented. An output of this 1/N frequency divider 125 is input to one input terminal of the exclusive OR gate 139, and also to the inverter 137. An output of the inverter 137 is input to the delay element 138 so as to be delayed by a predetermined time. An exclusive OR of the delayed output and the input data that is directly input is obtained by the exclusively OR gate 139.

Operations as to this circuit portion will now be explained with reference to a time chart of FIG. 17. Symbol "A" indicates input data, symbol "B" represents input data which is frequency-divided by 1/N, and symbol "C" indicates input data delayed by the delay element 138. An exclusively OR of an output of this 1/N frequency divider 125 and the input data delayed by the delay element 138 is obtained, so that such a pulse as shown by "D" is output from the EXOR gate 139. Since a reset pulse is input from the output of the EXOR gate 139 to the gated oscillator 131, the gated oscillator 131 is synchronized, and the output of the gated oscillator 131 is returned to an initial value every time the reset pulse is input. As a consequence, when the phase is going to be shifted, the output of the gated oscillator 131 is returned back to the initial value, so that such a stable reproduced clock without any phase shift as represented in E of FIG. 17 can be obtained. Then, the stable reproduced clock is output from the frequency multiplier 141, and the stable reproduced is output from the DFF 142.

Effects of the third embodiment of the present invention will now be listed as follows:
1) There is no limitation as to a packet length.
2) A stable operation can be obtained even in a high bit rate.
3) Preassemble is no longer required.
4) The clocks can be reproduced even in such a time period when no packet is provided.

Figure 18:
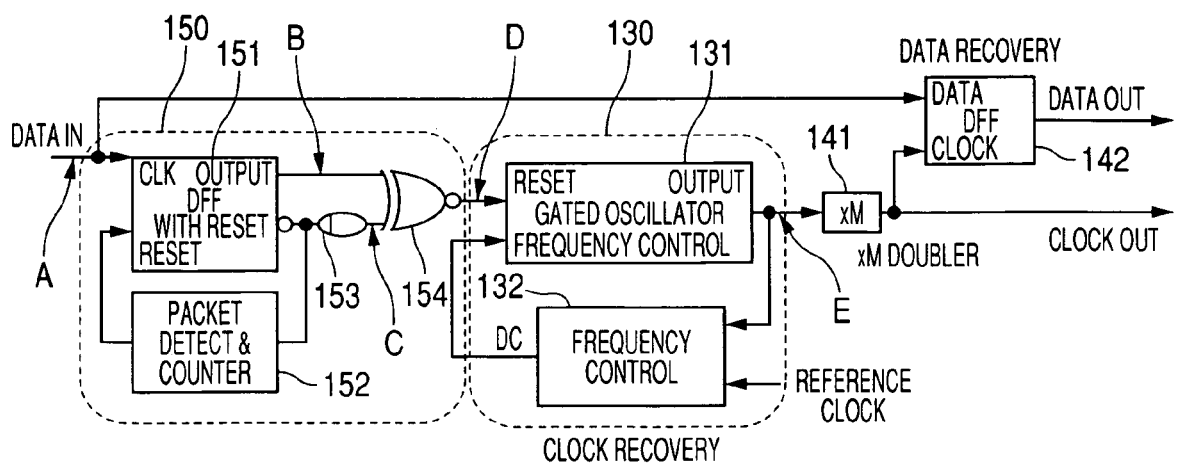
FIG. 18 is a block diagram for showing a fourth embodiment of the present invention.
Figure 19A:
FIG. 19 is a diagram for showing operating waveforms of the respective circuit portions of the circuit shown in FIG. 18.
Figure 19B:
Figure 19D:
Figure 19E:
Figures 19C, 20:
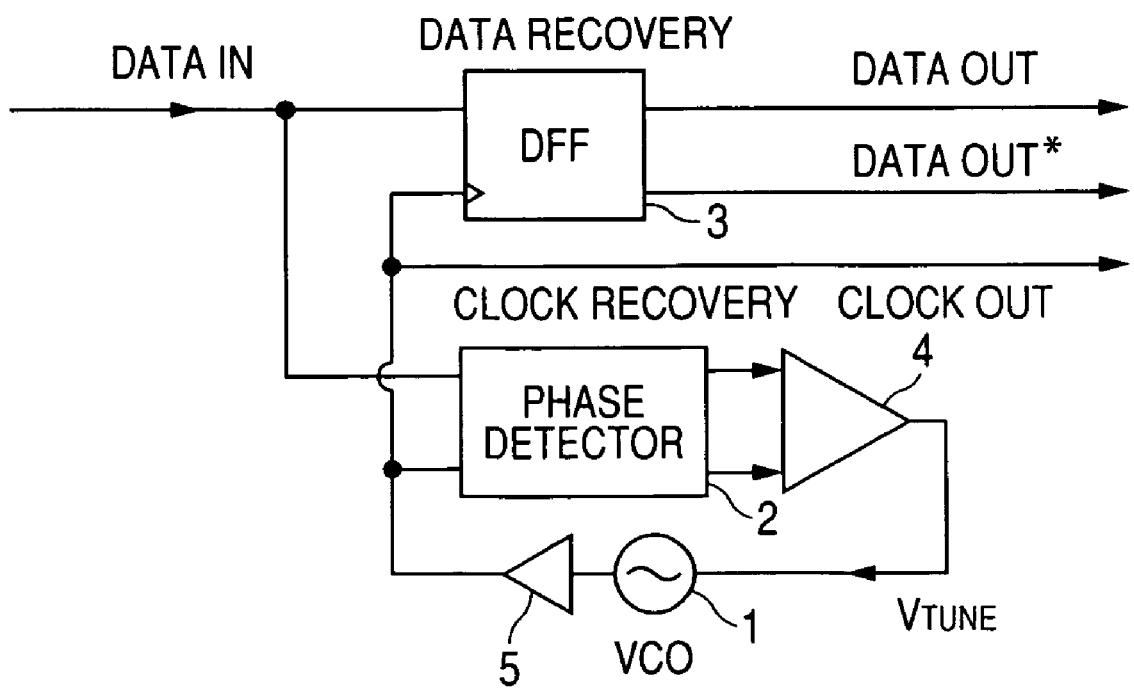
FIG. 20 is a block diagram for indicating a first example of the clock reproducing circuit of a related art.
Figure 21:
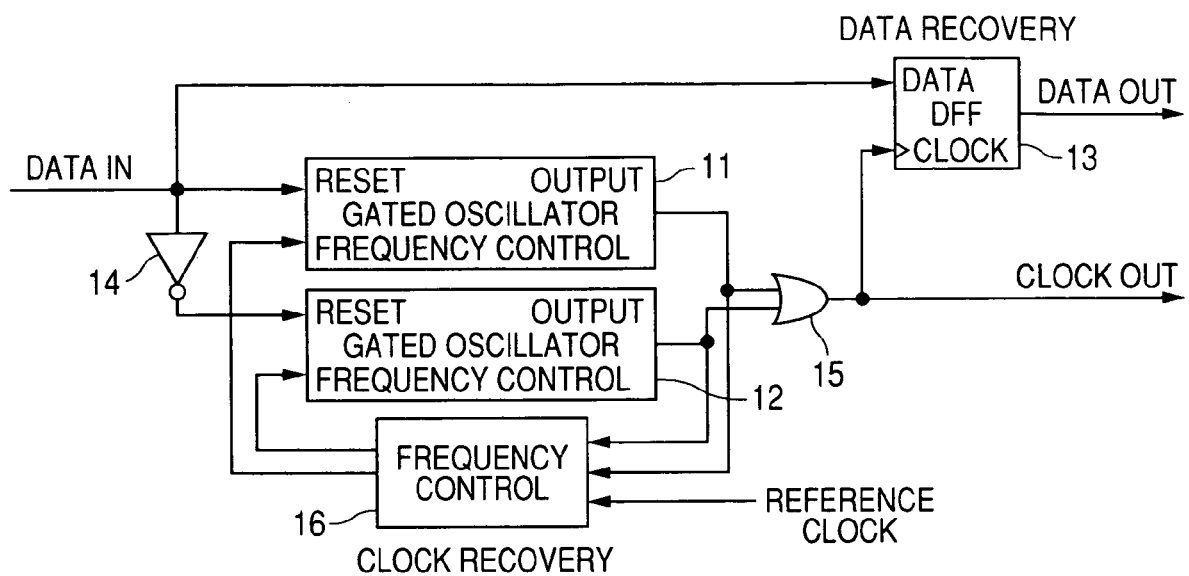
FIG. 21 is a block diagram for showing a second example of the clock reproducing circuit of a related art.

FIG. 18 is a block diagram for showing a clock reproducing apparatus according to a fourth embodiment of the present invention. It should be noted that the same reference numerals shown in FIG. 11 are employed as those for the same circuit elements. In the drawing, reference numeral 150 shows a pulse forming circuit. This pulse forming circuit 150 generates a reset pulse in synchronism with a head of a packet.

Reference numeral 130 shows a clock reproducing circuit. Arrangements of a frequency multiplier 141 and a DFF 142 are identical to those of FIG. 11.

A description is made of operations of the pulse forming circuit 150 in the circuit arranged in the above-explained manner. In this circuit, reference numeral 151 shows a DFF which receives input data by a clock input terminal, and reference numeral 152 shows a packet detect and counter (will be simply referred to as "counter" hereinafter) Q* signal (symbol "*" indicates inversion) of the DFF 151 is input to an input terminal of this counter 152. Also, an output of the counter 152 is input to the reset input terminal of the DFF 151. Although a D-input terminal of the DFF 151 is not shown, this D-input terminal is fixed to either an "H" level or an "L" level. Reference numeral 153 indicates a delay element into which the Q* signal of the DFF 151 is input, and an output of this delay element 153 is input to one input terminal of the EXOR gate 154. The Q output of the DFF 151 is directly input to the other input terminal of the EXOR gate 154. Other arrangements of this circuit are identical to those of FIG. 11.

FIG. 19 is a diagram for showing operating waveforms of the respective circuit portions of the circuit shown in FIG. 18. Symbol "A" shows a packet corresponding to the input data, symbol "B" represents an output of the DFF 151, symbol "C" indicates an output of the delay element 153, symbol "D" shows an output of the EXOR gate 154, and symbol "E" is an output of the gated oscillator 131. Since the input data is input to the clock input terminal of the DFF 151, at a rising edge of this input data, the fixed data being input to the D terminal thereof is output from a Q output terminal and a Q* output terminal of this DFF 151. It should be noted that the counter 152 counts the inverted output of the DFF 151, and when the count value thereof becomes over, the DFF 151 is reset.

This Q output is directly input to one input terminal of the EXOR gate 154, and the Q* output is delayed by the delay element 153. Thereafter, the delays Q* output is input to the other input terminal of the EXOR gate 154. The EXOR gate 154 obtains an exclusively OR of the B signal and the C signal, so that such a pulse as indicated by "D" is generated from the output terminal of the EXOR gate 154. Then, the gated oscillator 131 is reset by this pulse "D." In this case, the input data is input to the data input terminal of the DFF 142, whereas such a clock obtained by multiplying the output from the clock reproducing circuit 130 by the multiplication factor "M" in the M frequency multiplier 141 is input to the clock input of the DFF 142 as the reproduced clock. As a result, the reproduced data (DATA out) from the DFF 142 is output, and at the same time, a clock (CLOCK out) reproduced from the frequency multiplier 141 is output.

Effects of the fourth embodiment of the present invention will now be described as follows:
1) The clock reproducing apparatus can be operated by receiving the low speed reset signal.
2) A stable operation can be obtained even in a high bit rate.
3) Preassemble is no longer required.
4) A clock can be generated even if a packet is not present.

As previously explained, in accordance with the embodiments of the present invention, it is possible to provide such a clock reproducing apparatus capable of being operated in the burst mode, and also capable of being oscillated stably even in such a case of the high speed communication which si higher than or equal to 10 Gbps.

It will be apparent to those skilled in the art that various modifications and variations can be made to the described preferred embodiments of the present invention without departing from the spirit or scope of the invention. Thus, it is intended that the present invention cover all modifications and variations of this invention consistent with the scope of the appended claims and their equivalents.

What is claimed is:

1. A clock reproducing apparatus comprising:
a pulse forming circuit which receives input data and forms a pulse from the input data; and
a clock reproducing circuit,
wherein the clock reproducing circuit includes:
a gated oscillator; and
a frequency control circuit for comparing a phase of an output of the gated oscillator with a phase of a reference clock, and supplying a phase control signal to the gated oscillator based on the comparison result so as to set a delay time, and
wherein an output of the pulse forming circuit resets the gated oscillator, and
wherein an output of the gated oscillator is provided as a clock reproducing output,
characterized in that
the gated oscillator comprises at least two delay units, wherein each of the delay units is connected to the reset input terminal of the gated oscillator, and wherein
each delay unit comprises two routes being alternately activated depending on the input data, and wherein the input data are either "H" or "L", characterized in that the pulse forming circuit is a differentiating circuit for differentiating the input data.

2. A clock reproducing apparatus comprising:
a pulse forming circuit which receives input data and forms a pulse from the input data; and
a clock reproducing circuit,
wherein the clock reproducing circuit includes:
a gated oscillator; and
a frequency control circuit for comparing a phase of an output of the gated oscillator with a phase of a reference clock, and supplying a phase control signal to the gated oscillator based on the comparison result so as to set a delay time, and
wherein an output of the pulse forming circuit resets the gated oscillator, and
wherein an output of the gated oscillator is provided as a clock reproducing output,
characterized in that
the gated oscillator comprises at least two delay units, wherein each of the delay units is connected to the reset input terminal of the gated oscillator, and wherein
each delay unit comprises two routes being alternately activated depending on the input data, and wherein the input data are either "H" or "L", characterized in that the pulse forming circuit includes an exclusive OR gate for providing an exclusive OR of the input data and a signal that is obtained by delaying the input data for a predetermined amount.

3. A clock reproducing apparatus comprising:
a pulse forming circuit which detects a head of a packet which is input data and forms a reset pulse that is synchronized with the detected head; and
a clock reproducing circuit,
wherein the clock reproducing circuit includes:
a gated oscillator; and
a frequency control circuit for comparing a phase of an output of the gated oscillator with a phase of a reference clock, and supplying a phase control signal to the gated oscillator based on the comparison result so as to set a delay time, and
wherein an output of the pulse forming circuit resets the gated oscillator, and wherein an output of the gated oscillator is provided as a clock reproducing output, characterized in that the gated oscillator comprises at least two delay units, wherein each of the delay units is connected to the reset input terminal of the gated oscillator, and wherein each delay unit comprises two routes being alternately activated depending on the input data, and wherein the input data are either "H" or "L".

4. A clock reproducing apparatus comprising:

a pulse forming circuit which receives input data and forms a pulse from the input data; and a clock reproducing circuit, wherein the clock reproducing circuit includes:

a gated oscillator; and a frequency control circuit for comparing a phase of an output of the gated oscillator with a phase of a reference clock, and supplying a phase control signal to the gated oscillator based on the comparison result so as to set a delay time, and wherein an output of the pulse forming circuit resets the gated oscillator, and wherein an output of the gated oscillator is provided as a clock reproducing output, characterized in that the gated oscillator comprises at least two delay units, wherein each of the delay units is connected to the reset input terminal of the gated oscillator, and wherein each delay unit comprises two routes being alternately activated depending on the input data, and wherein the input data are either "H" or "L", wherein the pulse forming circuit comprises of a frequency divider which divides the input signal by 1/N.

5. A clock reproducing apparatus comprising:

a clock reproducing circuit, wherein the clock reproducing circuit includes:

a gated oscillator; and a frequency control circuit for comparing a phase of an output of the gated oscillator with a phase of a reference clock, and supplying a phase control signal to the gated oscillator based on the comparison result so as to set a delay time, wherein input data is input to a reset input terminal of the gated oscillator, characterized in that the gated oscillator comprises at least two delay units, wherein each of the delay units is connected to the reset input terminal of the gated oscillator, and wherein each delay unit comprises two routes being alternately activated depending on the input data, and wherein the input data are either "H" or "L", characterized by a frequency divider for dividing a frequency of the input data by 1/N and a frequency multiplier for multiplying the output of the gated oscillator by a factor M.

6. The clock reproducing apparatus as claimed in claim 5, characterized in that when one of the two routes of the oscillating circuit of the gated oscillator operates, the other of the two routes of the oscillating circuit on a non-operating side is reset.

* * * * *